(12) United States Patent
Yu

(10) Patent No.: US 6,492,670 B1
(45) Date of Patent: Dec. 10, 2002

(54) LOCALLY CONFINED DEEP POCKET PROCESS FOR ULSI MOSFETS

(75) Inventor: Bin Yu, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/821,258

(22) Filed: Mar. 29, 2001

Related U.S. Application Data

(62) Division of application No. 09/255,546, filed on Feb. 22, 1999.

(51) Int. Cl.[7] .............................................. H01L 29/80
(52) U.S. Cl. ...................... 257/284; 257/344; 438/291; 438/302; 438/305
(58) Field of Search ........................ 257/344; 438/291, 438/305, 174, 199, 300

(56) References Cited

U.S. PATENT DOCUMENTS

| | | | |
|---|---|---|---|
| 4,745,082 A | 5/1988 | Kwok | |
| 4,784,718 A | 11/1988 | Mitani et al. | |
| 5,264,382 A | 11/1993 | Watanabe | |
| 5,374,575 A | 12/1994 | Kim et al. | |
| 5,391,510 A | 2/1995 | Hsu et al. | |
| 5,429,956 A | 7/1995 | Shell et al. | |
| 5,466,957 A * | 11/1995 | Yuki et al. | 257/344 |
| 5,491,099 A | 2/1996 | Hsu | |
| 5,595,919 A | 1/1997 | Pan | |
| 5,675,159 A | 10/1997 | Oku et al. | |
| 5,716,861 A | 2/1998 | Moslehi | |
| 5,736,446 A | 4/1998 | Wu | |
| 5,856,225 A | 1/1999 | Lee et al. | |
| 5,858,843 A | 1/1999 | Doyle et al. | |
| 5,915,182 A | 6/1999 | Wu | |
| 5,926,712 A * | 7/1999 | Chen et al. | 438/291 |
| 5,985,726 A | 11/1999 | Yu et al. | |
| 6,080,630 A * | 6/2000 | Milic-Strkalj et al. | 438/305 |
| 6,096,586 A * | 8/2000 | Milic-Strkalj et al. | 438/174 |
| 6,110,783 A | 8/2000 | Burr | |
| 6,184,097 B1 | 2/2001 | Yu | |
| 6,207,482 B1 * | 3/2001 | Shih et al. | 438/199 |
| 6,248,637 B1 * | 6/2001 | Yu | 438/300 |

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

"Sub 50–nm FinFET: PMOS" by Xuejue, et al. IEEE, 1999.

* cited by examiner

Primary Examiner—David Nelms
Assistant Examiner—Mai-Huong Tran
(74) Attorney, Agent, or Firm—Foley & Lardner

(57) ABSTRACT

A method of fabricating an integrated circuit with locally confined deep pocket regions utilizes a dummy or sacrificial gate spacer. Dopants are provided through the openings associated with sacrificial spacers to form the pocket regions. The dopants are provided after silicidation. The openings can be filled with spacers. The process can be utilized for P-channel or N-channel metal oxide field semiconductor effect transistors (MOSFETS).

20 Claims, 2 Drawing Sheets

LOCALLY CONFINED DEEP POCKET PROCESS FOR ULSI MOSFETS

CROSS REFERENCE TO RELATED APPLICATIONS

This patent application is a divisional application of U.S. patent application Ser. No. 09/255,546, filed Feb. 22, 1999, and is related to U.S. Pat. No. 5,985,726, issued Nov. 16, 1999, by Yu et al., entitled "A Damascene Process for Forming Ultra-Shallow Source/Drain Extensions and Pocket in ULSI MOSFET", and assigned to the assignee of the present invention. This patent application is also related to U.S. Pat. No. 6,184,097, issued on Feb. 6, 2001, by Yu et al., entitled "A Process for Forming Ultra-Shallow Source/Drain Extensions", and assigned to the assignee of the present invention.

FIELD OF THE INVENTION

The present invention relates to integrated circuits and methods of manufacturing integrated circuits. More particularly, the present invention relates to a method of manufacturing integrated circuits having transistors with pocket regions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

As transistors disposed on integrated circuits (ICs) become smaller (e.g., transistors with gate lengths approaching 50 nm), CMOS fabrication processes have utilized a two-dimensional channel-doping technique. With reference to FIG. 1, a conventional MOSFET 110 is provided on a portion 112 of an integrated circuit. MOSFET 110 is provided between insulation regions 114 and includes a source 116, a drain 118, and a gate structure 120. Gate structure 120 includes spacers 122, a dielectric layer 124, and a gate conductor 127.

Dielectric layer 124 is provided between and partially over a source extension 126 and a drain extension 128 (e.g., above a channel region 130). A silicide layer 132 is formed over gate conductor 127, source 116, and drain 118. Channel region 130 does not include a two-dimensional doping implant, wherein the channel-doping profile in the lateral direction is non-uniform and the channel-doping profile in the vertical direction is a super-steep retrograded channel-doping profile. The two-dimensional channel-doping profile is critical to scaling (i.e., proportional operation and structural elements in the ultra-small dimensions of MOSFET 110).

MOSFET 110 includes shallow pocket regions 134 and 136 which effectively suppress the short-channel effect (which degrades the robustness of the transistor to random process variations). Shallow pocket regions 134 and 136 are provided in a conventional CMOS pocket implant process. The implant process is performed after gate structure 120 is fabricated and before layer 132 is formed. Regions 134 and 136 are not deeper than source 116 and drain 118. Regions 134 and 136 are formed before extensions 126 and 128, regions 116 and 118, and spacers 122.

Pocket regions 134 and 136 should be deep enough to suppress punch through effect. However, with conventional processes, regions 134 and 136 cannot be made deep enough without forming a "halo-like structure". The disadvantages "halo-like structure" are discussed below with reference to FIG. 2.

With reference to FIG. 2, a MOSFET 134 is substantially similar to MOSFET 110, as discussed with reference to FIG. 1. However, MOSFET 134 includes deep pocket implant regions 135 and 137. Channel 130 includes a two dimensional doping implant, wherein the channel-doping profile in the lateral direction is not uniform, and the channel-doping profile in the vertical direction is a super-steep retrograded channel-doping profile. Implants 135 and 137 are formed after extensions 126 and 128, drain 116, source 118, and spacers 122 in a conventional process. The pocket implant associated with regions 135 and 137 results in a "halo-like" structure around the border of regions 116 and 118 located proximate channel region 130.

The halo-like structure of pocket regions 135 and 137 (FIG. 2) increases the doping concentration near the junction of source 116 and drain 118. Increased doping concentration near the junction of source 116 and drain 118 degrades (i.e., increases) the source/drain junction capacitance (e.g., parasitic capacitance) and, hence, reduces the speed of MOSFET 134.

Thus, there is a need for a method of forming deeper pocket regions which do not have a halo-like structure. Further still, there is a need for transistors that have locally confined deep pocket regions. Even further still, there is a need for an efficient method of manufacturing deep pocket regions for a transistor having a two-dimensional channel profile.

SUMMARY OF THE INVENTION

The present invention relates to a method of manufacturing an integrated circuit. The integrated circuit includes a gate structure between a source region and a drain region in a semiconductor substrate. The gate structure includes a plurality of dielectric spacers. The method includes removing the dielectric spacers, thereby exposing the semiconductor substrate at a first location and a second location, and providing an ion implant at the first location and at the second location. The ion implant forms deep pocket regions.

The present invention further relates to a method of manufacturing an ultra-large scale integrated circuit including a plurality of field effect transistors having locally confined deeper pocket regions. The method includes steps of forming at least part of a gate structure on a top surface of a semiconductor substrate and between a source and a drain. The gate structure includes a spacer. The method also includes forming a silicide over at least the source and the drain, removing the spacer, and providing a dopant at a location associated with the spacer. The dopant forms the locally confined deeper pocket region.

The present invention still further relates to a process for forming a first pocket region at least partially below a shallow source extension and a second pocket region at least partially below a shallow drain extension. The process includes forming a plurality of gate structures on a top surface of a substrate, stripping dummy spacers associated with the gate structure to form openings to the substrate, and providing a dopant through the openings to the substrate. The dopant forms the first pocket region and the second pocket region.

The present invention also relates to an integrated circuit including a transistor. The transistor has a gate structure on a top surface of a semiconductor substrate and is disposed between a source and a drain. The transistor includes a first pocket region and a second pocket region. The first pocket region extends below the drain. The second pocket region extends below the source. The first pocket region meets the second pocket region under a channel.

BRIEF DESCRIPTION OF THE DRAWINGS

The exemplary embodiments of the present invention will hereinafter be described with reference to the accompanying drawings, wherein like numerals denote like elements.

DETAILED DESCRIPTION OF THE PREFERRED EXEMPLARY EMBODIMENTS

Figure 1:
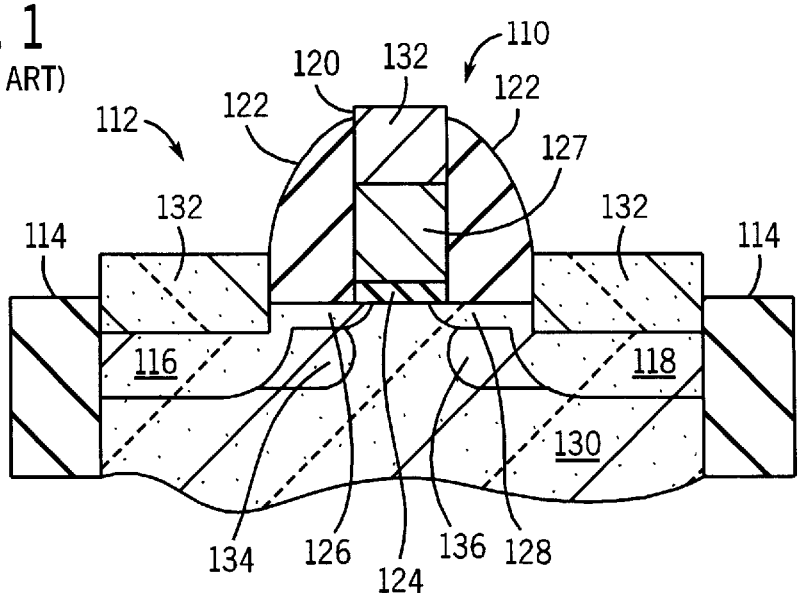
FIG. 1 is a cross-sectional view of a portion of an integrated circuit having conventional pocket regions.
Figure 2:
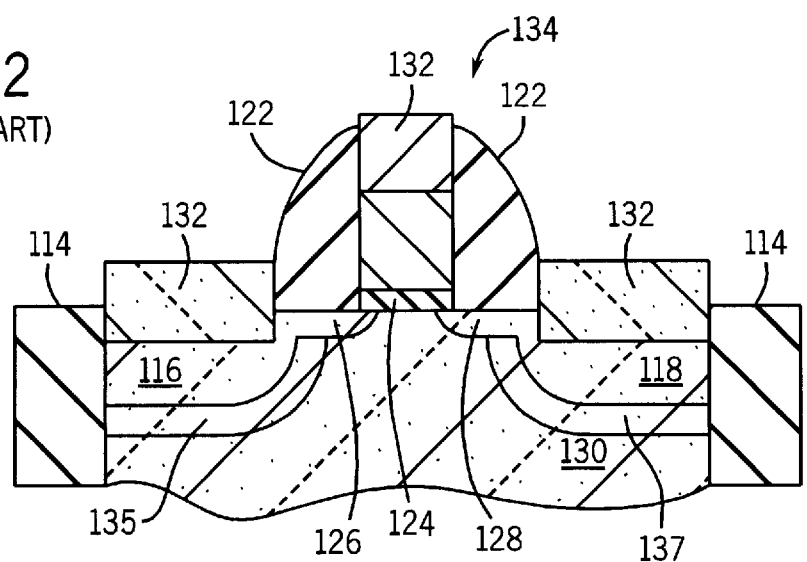
FIG. 2 is a cross-sectional view of the portion of the integrated circuit illustrated in FIG. 1, showing a halo-like structure for the conventional pocket regions.
Figure 3:
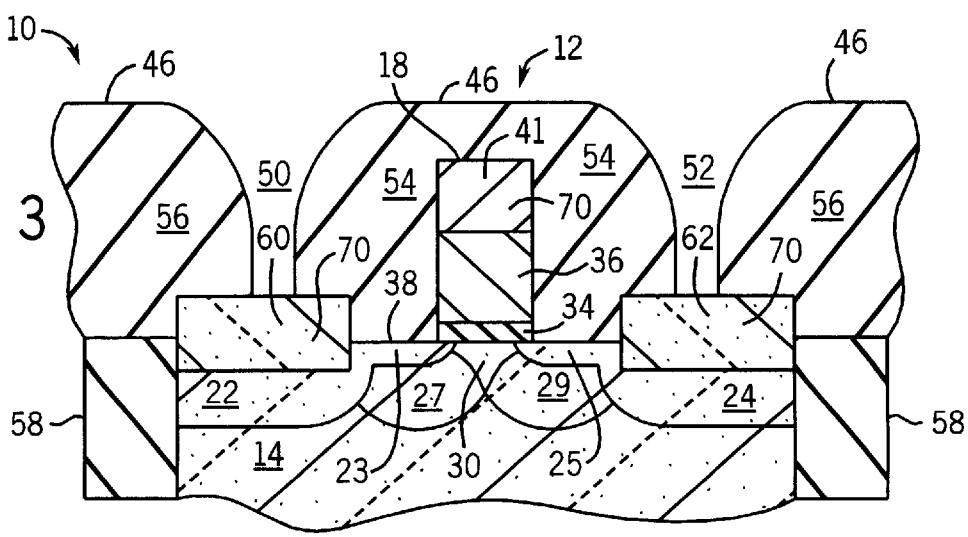
FIG. 3 is a cross-sectional view of a portion of the integrated circuit in accordance with an exemplary embodiment of the present invention.

With reference to FIG. 3, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 preferably has a gate length of less than 100 nanometer (nm) (e.g., approaching 50 nm). Alternatively, substrate 14 can be a thin-film layer that is part of a silicon-on-insulator substrate. Substrate 14 can be any semiconductor material, including gallium arsenide (GaAs), silicon (Si), germanium (Ge), or other material.

Transistor 12 includes a gate structure 18, a source region 22, and a drain region 24. Transistor 12 also includes a source extension 23 and a drain extension 25. In the exemplary embodiment, source region 22 and drain region 24 are 60–120 nm deep (60–120 nm below a top surface 38 of substrate 14). Transistor 12 can be an N-channel or P-channel field effect transistor (FET).

Extensions 23 and 25 are preferably ultra-shallow extensions (e.g., junction depth is less than 20–40 nm), which are thinner (i.e., shallower) than regions 22 and 24. Extensions 23 and 25 are connected to regions 22 and 24, respectively, and are disposed partially underneath a gate oxide 34. Ultra-shallow extensions 23 and 25 help transistor 12 achieve substantial immunity to short-channel effects. Short-channel effects can degrade performance of transistor 12, as well as the manufacturability of the IC associated with transistor 12. Regions 22 and 24 and, hence, extensions 23 and 25, have a concentration of $10^{19}$ to $10^{20}$ dopants per cubic centimeter.

Transistor 12 advantageously includes a pair of pocket implant regions, such as, a locally confined deep pocket implant region 27 and a locally confined deep pocket implant region 29. Regions 27 and 29 are at least partially situated below extensions 23 and 25, respectively. Regions 27 and 29 are preferably doped opposite (same as substrate 14) to extensions 23 and 25 at a concentration of $1 \times 10^{18}$ to $5 \times 10^{18}$ dopants per centimeter squared. Regions 27 and 29 are located 80–100 nm below top surface 38 of substrate 14 and underneath extensions 23 and 25, respectively. Pocket implant regions 27 and 29 are provided below extensions 23 and 25 to prevent source/drain punch-through in depletion regions.

Each of regions 27 and 29 has a width of 40–80 nm. Regions 27 and 29 connect or nearly connect at a middle point (left to right) of structure 18 underneath gate structure 18. Regions 27 and 29 share a boundary with extensions 23 and 25 and regions 22 and 24, respectively. Regions 27 and 29 have a curved V-shaped boundary 30 underneath structure 18 (e.g., the channel of transistor 12). The V-shaped boundary 30, or valley associated with the channel, provides advantageous dimensional doping engineering. Regions 27 and 29 have a somewhat lemon-drop shape and do not have a halo-like structure due to the advantageous self-aligned and confined implantation process described below. Regions 27 and 29 are deeper than regions 22 and 24.

Pocket regions 27 and 29 are implanted to provide two-dimensional channel-doping profile engineering, thereby achieving immunity to short-channel effects. Regions 27 and 29 are preferably implanted by an ion-implantation technique and include opposite dopants to the dopants utilized in regions 22 and 24. Accordingly, an appropriate dopant for pocket regions 27 and 29 is boron, boron difluoride, or indium when transistor 12 is an N-channel transistor, and an appropriate dopant for pocket regions 27 and 29 is arsenic, phosphorous, or antimony when transistor 12 is a P-type transistor.

Preferably, heavy ions, such as, indium (In) and antimony (Sb) are used for regions 27 and 29. A self-amorphization occurs in the channel region where the concentration of indium and antimony is heavy because of the relatively high dose used for deep pocket implants. Preferably, the dopant activation temperature can be as low as 600–700° C. due to the self-amorphized channel region.

Transistor 12 can be an N-channel or a P-channel metal oxide semiconductor field effect transistor (MOSFET). Transistor 12 is provided between two insulative structures 58, which can be shallow trench isolation structures. The channel of transistor 12 is subjected to two-dimensional channel-doping profile engineering.

Gate structure 18 is preferably 1000–2000 Å thick and includes a silicide layer 41, gate oxide 34, and a gate conductor 36. Gate oxide 34 is preferably thermally grown on substrate 14 to a thickness of 20–50 Å. Alternatively, oxide 34 can be an insulative layer, such as, a silicon nitride ($Si_3N_4$) or a silicon oxynitride (SiON), provided by chemical vapor deposition (CVD).

Conductor 36 is can be deposited by chemical vapor deposition (CVD) and with oxide 34, can be etched to form the particular gate structure 18 for transistor 12. Conductor 36 can be polysilicon or polysilicon/germanium doped with P-type or N-type dopants.

A silicide layer 70 is formed over transistor 12. A portion 41 of silicide layer 70 is formed over conductor 36. Conductor 36 can also be a metal. Additionally, a portion 60 of silicide layer 70 is provided over source region 22, and a portion 62 of silicide layer 70 is provided over drain region 24. Portions 41, 60, and 62 are preferably 100–200 Å thick layers of titanium silicide (PiSi$_2$), nickel silicide (NiSi$_2$), cobalt silicide (CoSi$_2$), or other conductive materials. Seventy percent (70–140 Å) of portions 60 and 62 extend below top surface 38 of substrate 14. Portion 41 is similar to layers 60 and 62. Preferably, pocket implantation is performed after silicidation such that silicide portions 41, 60, and 62 can act as an implant mask to block dopants from entering the source/drain junction area. Additionally, heavy ions, such as, indium (In) for P-type dopants, and antimony (Sb) for N-type dopants, can be used for the pocket implant.

Most elements of transistor 12 can be manufactured according to conventional complementary metal oxide semiconductor (CMOS) process steps. Transistor 12 can be at least partially covered by insulative layer 46 in a CVD TEOS process and is preferably part of an ultra-large scale integrated (ULSI) circuit that includes 1,000,000 or more transistors. Insulative layer is preferably 1000–2000 Å thick. Vias or holes 50 and 52 are etched in insulative layer 46 to form spacer sections 54 and sections 56.

With reference to FIGS. 3–6, the fabrication of transistor 12, including pocket regions 27 and 29, is described below as follows. The advantageous process forms regions 27 and 29 after silicide portions 41, 60, and 62 are formed. In this manner, portions 41, 60, and 62 are used as a mask when implanting regions 27 and 29. Thus, a lower thermal budget can be utilized after regions 27 and 29 are formed because portions 41, 60, and 62 are already provided.

Figure 4:
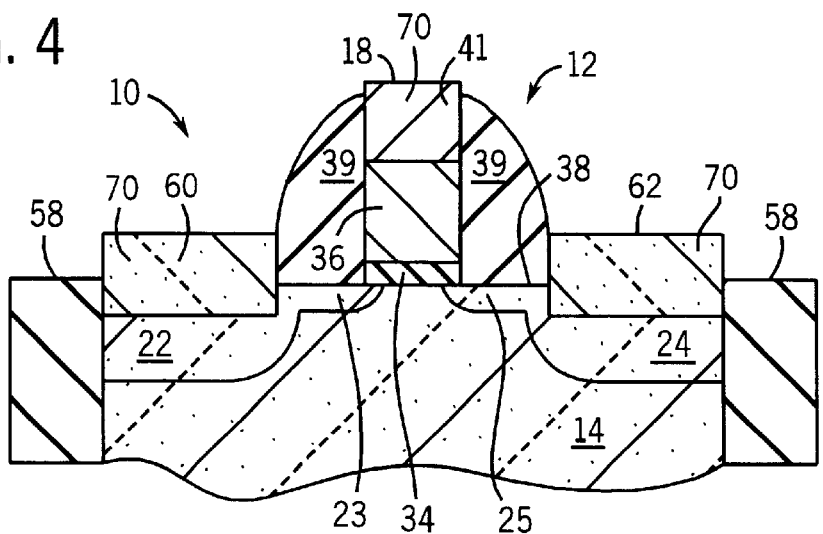
FIG. 4 is a cross-sectional view of the portion of the integrated circuit illustrated in FIG. 3, showing a silicidation step.

In FIG. 4, transistor 12 can be substantially formed by conventional semiconductor processing techniques to form gate structure 18, including gate oxide 34, dummy or sacrificial spacer material 39, gate conductor 36, source region 22, extension 23, extension 25, and drain region 24. Transistor 12 is provided between structures 58.

Substrate 14 is doped in an ion-implantation process or diffusion process to form source region 22 and drain region 24. Regions 22 and 24 extend deeply below (e.g., 60–120 nm) top surface 38 of substrate 14. Source region 22 and drain region 24 can be heavily doped with boron (B) or phosphorous (P), depending upon the type of transistor 12. Alternatively, other dopants can be utilized.

Gate structure 18 includes dummy spacer material 39, which is silicon dioxide or silicon nitride formed in a conventional process. A layer for dummy spacer material 39 can be deposited in a plasma enhanced chemical vapor deposition (PECVD) process as a 1,000 to over 2,000 Å thick silicon nitride (Si$_3$N$_4$) layer. The nitride layer is selectively etched to leave dummy spacer material 39 adjacent gate stack 18. Dummy spacer material 39 is preferably 1,000–2,000 Å thick, and each structure of dummy spacer material 39 is approximately 500–800 Å wide. Alternatively, other spacer materials, such as, silicon dioxide, silicon oxynitride, or other insulator can be utilized for material 39.

After dummy spacer material 39 is provided adjacent gate structure 18, portion 10 is subjected to a conventional silicidation process to form silicide portions 41, 60, and 62. Portions 41, 60, and 62 can be formed in a conventional process, wherein a refractory metal (e.g., Co, Ti, Ni) is deposited by CVD and reacted with exposed surfaces of silicon associated with conductor 36, region 22, and region 24.

Atoms of the refractory metal react with the exposed silicon (e.g., in a thermal process) to form silicide material. The refractory metal does not react with dummy spacer material 39 (silicon nitride). Therefore, silicide layer 70 is not formed on dummy spacer material 39. After the reaction, which forms portions 41, 60, and 62, the unreacted refractory metal is removed. Portions 41, 60, and 62 advantageously reduce contact resistance.

Figure 5:
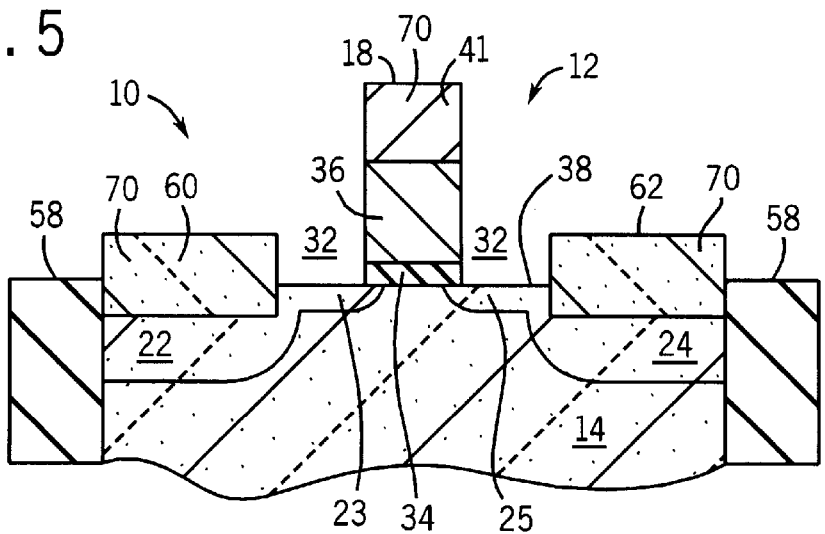
FIG. 5 is a cross-sectional view of the portion of the integrated circuit illustrated in FIG. 3, showing a wet chemical-etching step.

In FIG. 5, after portions 41, 60, and 62 are formed, dummy spacer material 39 is removed to leave openings 32 adjacent gate structure 18. Openings 32 define a space of exposed silicon on substrate 14 above extensions 23 and 25. Openings 32 are between portions 60 and 41 and between portions 41 and 62.

Dummy spacer material 39 can be stripped from portion 10 by any removal process, including a chemical wet-etching process, a dry-etching process, or a plasma dry-etching process. Material 39 is preferably removed in a wet chemical-etching process. The wet-etching process is preferably selective to silicon nitride with respect to silicon and silicon dioxide as to not affect substrate 14 and structures 58. Alternatively, structures 58 can be covered by a protection layer. Portions 41, 60, and 62 advantageously protect substrate 14 and gate stack 18. Openings 32 are preferably 500–800 Å in width. Openings 32 also align and confine regions 27 and 29.

Figure 6:
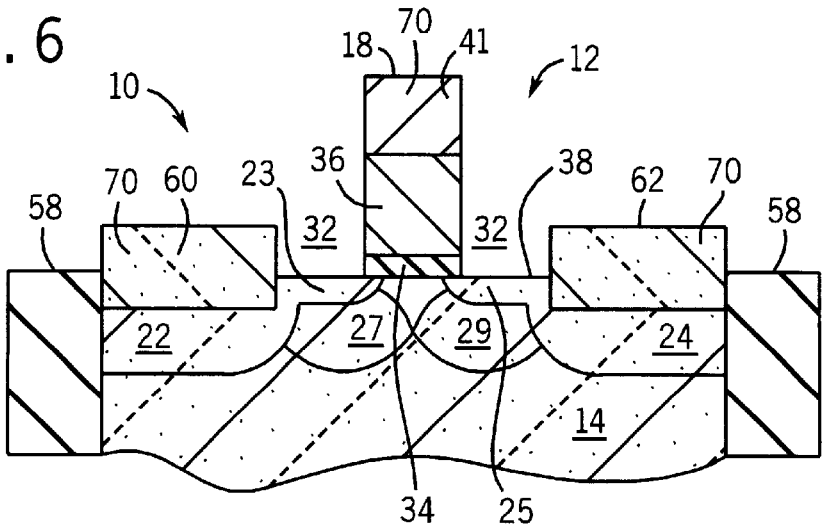
FIG. 6 is a cross-sectional view of the portion of the circuit illustrated in FIG. 3, showing a pocket implantation step.

In FIG. 6, an ion or dopant-implantation technique is utilized to form pocket regions 27 and 29. Regions 27 and 29 are preferably between 50–80 nm below top surface 38 of substrate 14. The ion-implantation technique can use conventional implantation devices manufactured by Varian Co. of Palo Alto, Calif. Regions 27 and 29 can be formed by providing a pocket implant through openings 32 at a tilt angle of approximately 15–60°. Preferably, a tilt angle of 20–400° is utilized.

Generally, dopants are accelerated to an energy of 40 KeV–120 KeV and implanted 80–160 nm (20–40 nm deeper than regions 22 and 24) beneath top surface 38 of substrate 14. The dopants implanted in regions 27 and 29 have the opposite conductivity to the dopants utilized in drain region 22 and in source region 24. Preferably, antimony (Sb) ions are utilized for P-channel MOSFETs, and indium (In) ions are utilized for N-channel MOSFETs. Regions 27 and 29 begin at a depth of 20–40 nm below top surface 38 of substrate 14.

Heavy ions, such as, indium and antimony, are advantageous because a self-amorphization occurs underneath gate structure 18, where the concentration of the indium or antimony is high or heavy. In the self-amorphized channel region, the dopant activation temperature can be as low as 600–700° C. Therefore, the dopants in regions 27 and 29 can be electrically activated without introducing a significant thermal budget after the formation of layers 41, 60, and 62.

In FIG. 3, insulative layer 46 is provided over transistor 12 (e.g., structures 58, portion 41, portion 60, portion 62, and openings 32). Insulative layer 46 is preferably silicon dioxide deposited in a tetraorthosilicate (TEOS) process at a low temperature (e.g., less than 400° C.). Insulative layer 46 is initially 500–1000 nm thick.

Layer 46 is subjected to a chemical mechanical polish (CMP) to planarize layer 46. Layer 46 is etched to form vias 50 and 52 for contacts and local interconnects. A conventional CMOS process can be utilized to form contacts and interconnects for transistor 12 and otherwise complete fabrication of portion 10.

It is understood that, while preferred embodiments, examples, materials, and values are given, they are for the purpose of illustration only. The apparatus and method of the invention are not limited to the precise details and conditions disclosed. For example, although wet-etching techniques are discussed, other methods could be utilized to remove structures. Thus, changes may be made to the details disclosed without departing from the spirit of the invention, which is defined by the following claims.

What is claimed is:

1. An integrated circuit comprising a transistor having a gate structure on a top surface of a semiconductor substrate and disposed between a source and a drain, the transistor including a first pocket region and a second pocket region, the first pocket region extending below the drain, the second pocket region extending below the source, wherein the first pocket region meets the second pocket region under a channel, wherein the first pocket region includes an upper border having a first end terminating at the drain and a bottom border terminating at the drain exclusive of the top surface.

2. The integrated circuit of claim 1, wherein the borders of the first and second pocket regions define a valley.

3. The integrated circuit of claim 1, wherein the first and second pocket regions have a lemon drop shape.

4. The integrated circuit of claim 3, wherein the boards of the first and second pocket region are adjacent boarders of the drain.

5. The integrated circuit of claim 4, wherein the boarders of the drain and the source include an extension boarder, the first end terminating at the extension border of the drain.

6. The integrated circuit of claim 1, wherein the source and the drain are silicided and the first pocket region is substantially confined in a lateral direction by the silicided region.

7. An integrated circuit, comprising:
   a gate structure between a source region and a drain region in a semiconductor substrate, and deep pocket regions, the deep pocket regions defining a V-shaped boundary underneath the gate structure and above the deep pocket regions, wherein the V-shaped boundary has a first end termination at a source border of the source region and a second end termination at a drain border of the source region and a second region end terminating at a drain border of the drain region whereby a channel region underneath the gate structure has a two dimensional channel doping profile.

8. The integrated circuit of claim 7, comprising:
   a silicide layer over the source region, the drain region, and the gate structure.

9. The integrated circuit of claim 8, further comprising at least one spacer at least partially above the silicide layer.

10. The integrated circuit of claim 9, wherein the spacer covers the entire gate structure.

11. The integrated circuit of claim 10, wherein the spacer is silicon dioxide.

12. The integrated circuit of claim 7, wherein the spacer has an upside down U-shape.

13. The integrated circuit of claim 12, wherein the spacer entirely covers the silicide layer above the gate structure.

14. The integrated circuit of claim 13, wherein the spacer partially covers the silicide layer above the source region and the drain region.

15. The integrated circuit of claim 7, wherein the deep pocket regions have a depth of more than 60 nm.

16. The integrated circuit of claim 7, wherein the deep pocket regions have a depth greater than the depth of the drain region.

17. A transistor comprising:
   a gate above a substrate, the substrate including a source and a drain, the gate being above a channel region between the source and the drain, the channel region being defined by locally confined pocket regions, the channel region having a V-shaped boundary;
   wherein the locally confined pocket regions defining the V-shaped boundary for the channel region underneath the gate structure and above the pocket regions, wherein the locally confined pocket regions each include an upper border corresponding to the V-shaped border and terminating into one of the source or the drain and a bottom border terminating into the one of the source or the drain.

18. The transistor of claim 17, wherein the V-shaped boundary has curved segments concave with respect to the pocket regions.

19. The transistor of claim 17, wherein the transistor has a two-dimensional doping profile in a channel region.

20. The transistor of claim 17, wherein the pocket regions are somewhat lemon drop-shaped.

* * * * *

UNITED STATES PATENT AND TRADEMARK OFFICE
CERTIFICATE OF CORRECTION

PATENT NO. : 6,492,670 B1
DATED : December 10, 2002
INVENTOR(S) : Bin Yu

It is certified that error appears in the above-identified patent and that said Letters Patent is hereby corrected as shown below:

<u>Column 7,</u>
Line 24, delete "boards" and insert -- borders --.
Lines 25 and 27, delete "boarders" and insert -- borders --.
Line 28, delete "boarder" and insert -- border --.
Lines 40 and 41, delete "termination" and insert -- terminating --.
Line 42, delete "source" and insert -- drain --.
Lines 42-43, delete "and a second region end terminating at a drain border of the drain region".

Signed and Sealed this

Thirteenth Day of May, 2003

JAMES E. ROGAN
*Director of the United States Patent and Trademark Office*